US009607111B2

(12) United States Patent
Aish et al.

(10) Patent No.: US 9,607,111 B2
(45) Date of Patent: Mar. 28, 2017

(54) SPATIAL INFORMATION MODELING OF BUILDINGS USING NON-MANIFOLD TOPOLOGY VIA A 3D GEOMETRIC MODELING KERNEL AND DESIGNSCRIPT

(71) Applicant: Autodesk, Inc., San Rafael, CA (US)

(72) Inventors: Roslyn Robert Aish, Winchester (GB); Aparajit Pratap, Northvale (SG)

(73) Assignee: Autodesk, Inc., San Rafael, CA (US)

( * ) Notice: Subject to any disclaimer, the term of this patent is extended or adjusted under 35 U.S.C. 154(b) by 940 days.

(21) Appl. No.: 13/925,489

(22) Filed: Jun. 24, 2013

(65) Prior Publication Data
US 2014/0005986 A1 Jan. 2, 2014

Related U.S. Application Data

(60) Provisional application No. 61/665,156, filed on Jun. 27, 2012.

(51) Int. Cl.
*G06F 17/50* (2006.01)

(52) U.S. Cl.
CPC ................ *G06F 17/5004* (2013.01)

(58) Field of Classification Search
CPC ..... G06F 17/5004; G06F 17/50; G06T 17/10; G06T 2210/21
USPC ................... 703/1; 700/97–98; 345/419–420
See application file for complete search history.

(56) References Cited

U.S. PATENT DOCUMENTS

| 7,653,518 B2* | 1/2010 | Kulkarni | G06T 17/10 345/19 |
| 8,983,805 B2* | 3/2015 | Rameau | G06F 17/50 345/629 |
| 2007/0291028 A1* | 12/2007 | Kripac | G06T 17/20 345/420 |
| 2011/0295564 A1* | 12/2011 | Chazal | G06F 17/50 703/1 |

OTHER PUBLICATIONS

Kou et al. "Modeling complex heterogeneous objects with non-manifold heterogeneous cells". Computer-Aided Design 38 (2006) 457-474.*
Treeck et al. "Dimensional reduction of 3D building models using graph theory and its application in building energy simulation". Engineering with Computers (2007) 23:109-122.*
Schlueter et al. ."Building information model based energy/exergy performance assessment in early design stages". Automation in Construction 18 (2009) 153-163.*
"3dsMax—ProCutter Compound Object", May 5, 2012. http://docs.autodesk.com/3DSMAX/15/ENU/3ds-Max-Help/files/GUID-D8229784-.

(Continued)

*Primary Examiner* — Eunhee Kim
(74) *Attorney, Agent, or Firm* — Gates & Cooper LLP

(57) ABSTRACT

A method, apparatus, system, and computer program product provide the ability to utilize a spatial model. A first input body and a second input body are obtained. A non-regular Boolean operation is performed that combines the first input body and the second input body to create and output an output body. The output body is a spatial model represented by a non-manifold solid body. A topological property of the non-manifold solid body is exposed to select and control an attribute of a building component represented by the non-manifold solid body.

22 Claims, 12 Drawing Sheets

(56) References Cited

OTHER PUBLICATIONS

Jabi, W., "Parametric Spatial Models for Energy Analysis in the Early Design Stages", Symposium on Simulation for Architecture and Urban Design, SimAUD 2014, Tampa, FL., Welsh School of Architecture, Cardiff University, Cardiff, UK.
Email A from an Inventor Robert Aish, Mar. 11, 2015.
Email B from an Inventor Robert Aish, Mar. 14, 2015.
Ceccanti, F., et al., "3D Printing Technology for a moon outpost exploiting lunar soil", 61st Int. Astronautical congress Prague, 2010. http://www.spacerenaissance.org/projects/LHD/Praga_Conference_Luna.pdf.

* cited by examiner

FIG. 5

| | union | intersection | difference | impose | imprint | slice |
|---|---|---|---|---|---|---|
| non-regular inputs | A, B overlapping | A, B overlapping | A, B overlapping | A, B overlapping | A, B overlapping | A with B [plane] |
| regular operations | Some laminar faces created (should these be removed?) | (small intersection square) | (L-shaped difference) | N/A | only imprint edges on external faces, no new cells created | multiple bodies each with cells |
| non-regular operations | 1 body with multiple cells | N/A | N/A | internal faces of the blank (A) within the tool (B) are removed | imprint external faces of B within A, creating cells | (sliced square with cells) |

SPATIAL INFORMATION MODELING OF BUILDINGS USING NON-MANIFOLD TOPOLOGY VIA A 3D GEOMETRIC MODELING KERNEL AND DESIGNSCRIPT

CROSS-REFERENCE TO RELATED APPLICATIONS

This application claims the benefit under 35 U.S.C. Section 119(e) of the following and commonly-assigned U.S. provisional patent application(s), which is/are incorporated by reference herein:

Provisional Application Ser. No. 61/665,156, filed on Jun. 27, 2012, by Roslyn Robert Aish and Aparajit Pratap, entitled "SPATIAL INFORMATION MODELING OF BUILDINGS USING NON-MANIFOLD TOPOLOGY VIA ASM AND DESIGNSCRIPT.

This application is related to the following and commonly-assigned patent application, which application is incorporated by reference herein:

U.S. patent application Ser. No. 13/306,730, filed on Nov. 29, 2011, now U.S. Pat. No. 8,825,459, entitled "MULTI-MODAL MANIPULATION OF A GEOMETRIC MODEL", by Roslyn Robert Aish, et. al., which application claims the benefit under 35 U.S.C. 119(e) to U.S. Provisional Patent Application Ser. No. 61/417,808, filed on Nov. 29, 2010, entitled "DESIGN SCRIPT, A MULTI-PROGRAMMING PARADIGM LANGUAGE SYSTEM", by Roslyn Robert Aish, et. al.

BACKGROUND OF THE INVENTION

1. Field of the Invention.

The present invention relates generally to architectural geometry, and in particular, to a method, apparatus, system, computer program product, and article of manufacture for supporting a design of "spatial" architecture and the use of a spatial analysis of building models in related engineering design processes.

2. Description of the Related Art.

Much of the discourse in architectural geometry has focused on the geometric design and physical optimization of the material 'Building Model', specifically the building structure, envelope, and the digital fabrication of facades.

Embodiments of the invention go behind the facade and consider architecture not so much as a physical building model, but rather as the 'enclosure of space'. The intent is to explore related geometric and topological concepts which can be the foundation of appropriate computational design tools. The objective of these tools is to support the design of a 'spatial' architecture and the use of the spatial analysis of building models in related engineering design processes. To achieve this the concept of non-manifold topology implemented in a three-dimensional (3D) geometric modeling kernel (e.g., the ASM [Autodesk™ Shape Manager™] 3D geometric modeling kernel) is used, but in a novel way in which the interior of what would normally be referred to as a 'solid body' is not thought of being made of solid material, but rather as an enclosed void that can be used in an architectural sense as the 'enclosure of space'.

SUMMARY OF THE INVENTION

Much of the discourse in architectural geometry has focused on the geometric design and physical optimization of the material 'Building Model', specifically the building structure, envelope, and the digital fabrication of facades.

Embodiments of the invention go behind the facade and consider architecture not so much as a physical building model, but rather as the 'enclosure of space'. The intent is to explore related geometric and topological concepts which can be the foundation of appropriate computational design tools. The objective of these tools is to support the design of a 'spatial' architecture and the use of the spatial analysis of building models in related engineering design processes.

To achieve this, the concept of non-manifold topology implemented in a 3D modeling kernel is utilized, but in a novel way in which the interior of what would normally be referred to as a 'solid body' is not thought of being made of solid material, but rather as an enclosed void that can be used in an architectural sense as the 'enclosure of space'.

To realize this concept, a set of special non-regular Boolean operations are used to create non-manifold bodies and a series of topological classes that allow the user to access the resulting spatial models. Topological query functions are provided to allow the user to make a traversal of the spatial model of the building.

In view of the above, one may distinguish between a spatial model of the building (as the partitioning of the building envelope into discrete cells representing the interior spaces or rooms) and the material model of the building which might use the topology of the spatial model (for example, the cells, faces, edges and vertices) as supporting geometry. This topological and geometric modeling functionality is combined with the DesignScript associative modeling language (described in the cross referenced application that is incorporated by reference herein). Spatial Information Modeling and parametric/associative modeling work well together and allow the designer to experiment with 'what-if' scenarios. Changes to the spatial model can associatively update any downstream engineering analysis (such as a web-based energy analysis software [e.g., Green Building Studio™ available from the assignee of the present application]) and the dependent material model.

BRIEF DESCRIPTION OF THE DRAWINGS

Referring now to the drawings in which like reference numbers represent corresponding parts throughout:

FIG. 5 illustrates the result of different regular or non-regular Boolean operations within non-manifold bodies as inputs in accordance with one or more embodiments of the invention;

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Hardware Environment

Figure 1:
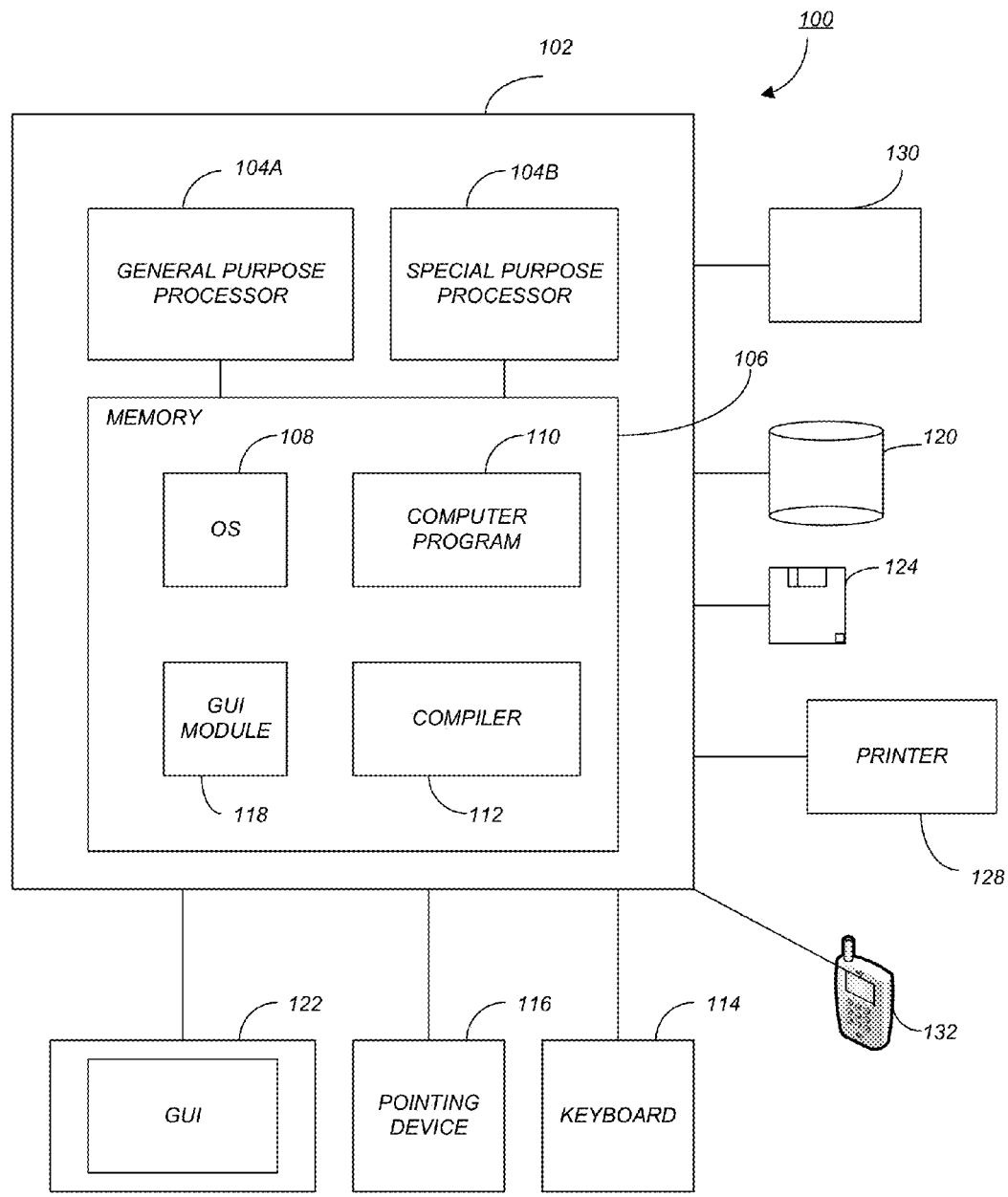
FIG. 1 is an exemplary hardware and software environment used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to, and/or integrated with, other devices, including input/output (I/O) devices such as a keyboard 114, a cursor control device 116 (e.g., a mouse, a pointing device, pen and tablet, touch screen, multi-touch device, etc.) and a printer 128. In one or more embodiments, computer 102 may be coupled to, or may comprise, a portable or media viewing/listening device 132 (e.g., an MP3 player, iPod™, Nook™, portable digital video player, cellular device, personal digital assistant, etc.). In yet another embodiment, the computer 102 may comprise a multi-touch device, tablet device, mobile phone, gaming system, internet enabled television, television set top box, or other internet enabled device executing on various platforms and operating systems.

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108, to provide output and results.

Output/results may be presented on the display 122 or provided to another device for presentation or further processing or action. In one embodiment, the display 122 comprises a liquid crystal display (LCD) having a plurality of separately addressable liquid crystals. Alternatively, the display 122 may comprise a light emitting diode (LED) display having clusters of red, green and blue diodes driven together to form full-color pixels. Each liquid crystal or pixel of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118A. Although the GUI module 118A is depicted as a separate module, the instructions performing the GUI functions can be resident or distributed in the operating system 108, the computer program 110, or implemented with special purpose memory and processors.

In one or more embodiments, the display 122 is integrated with/into the computer 102 and comprises a multi-touch device having a touch sensing surface (e.g., track pod or touch screen) with the ability to recognize the presence of two or more points of contact with the surface. Examples of multi-touch devices include mobile devices (e.g., iPhone™, Nexus S™, Droid™ devices, etc.), tablet computers (e.g., iPad™, HP Touchpad™), portable/handheld game/music/video player/console devices (e.g., iPod Touch™, MP3 players, Nintendo 3DS™, PlayStation Portable™, etc.), touch tables, and walls (e.g., where an image is projected through acrylic and/or glass, and the image is then backlit with LEDs).

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 102 may also implement a compiler 112 that allows an application program 110 written in a programming language such as COBOL, Pascal, C++, FORTRAN, or other language to be translated into processor 104 readable code. Alternatively, the compiler 112 may be an interpreter that executes instructions/source code directly, translates source code into an intermediate representation that is executed, or that executes stored precompiled code. Such source code may be written in a variety of programming languages such as Java™, Perl™, Basic™, etc. After completion, the application or computer program 110 accesses and manipulates data accepted from I/O devices and stored in the memory 106 of the computer 102 using the relationships and logic that were generated using the compiler 112.

The computer 102 also optionally comprises an external communication device such as a modem, satellite link, Ethernet card, or other device for accepting input from, and providing output to, other computers 102.

In one embodiment, instructions implementing the operating system 108, the computer program 110, and the compiler 112 are tangibly embodied in a non-transient computer-readable medium, e.g., data storage device 120, which could include one or more fixed or removable data storage devices, such as a zip drive, floppy disc drive 124, hard drive, CD-ROM drive, DVD drive, tape drive, etc. Further, the operating system 108 and the computer program 110 are comprised of computer program instructions which, when accessed, read and executed by the computer 102, cause the computer 102 to perform the steps necessary to implement and/or use the present invention or to load the program of instructions into a memory, thus creating a special purpose data structure causing the computer to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 102.

Figure 2:
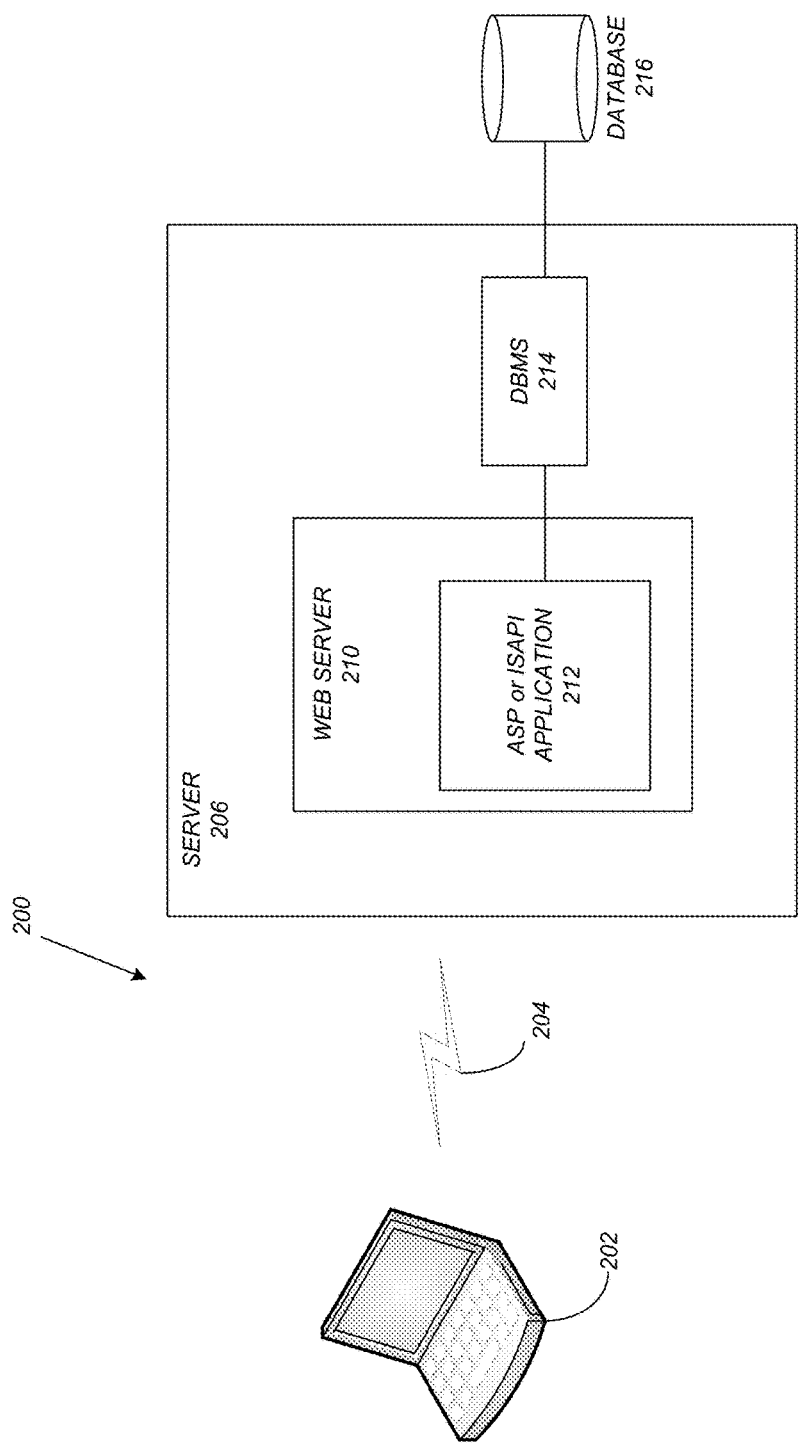
FIG. 2 schematically illustrates a typical distributed computer system using a network to connect client computers to server computers in accordance with one or more embodiments of the invention.

FIG. 2 schematically illustrates a typical distributed computer system 200 using a network 204 to connect client computers 202 to server computers 206. A typical combination of resources may include a network 204 comprising the Internet, LANs (local area networks), WANs (wide area networks), SNA (systems network architecture) networks, or the like, clients 202 that are personal computers or workstations, and servers 206 that are personal computers, workstations, minicomputers, or mainframes (as set forth in FIG. 1). However, it may be noted that different networks such as a cellular network (e.g., GSM [global system for mobile communications] or otherwise), a satellite based network, or any other type of network may be used to connect clients 202 and servers 206 in accordance with embodiments of the invention.

A network 204 such as the Internet connects clients 202 to server computers 206. Network 204 may utilize ethernet, coaxial cable, wireless communications, radio frequency (RF), etc. to connect and provide the communication between clients 202 and servers 206. Clients 202 may execute a client application or web browser and communicate with server computers 206 executing web servers 210. Such a web browser is typically a program such as MICROSOFT INTERNET EXPLORER™, MOZILLA FIREFOX™, OPERA™, APPLE SAFARI™, GOOGLE CHROME™, etc. Further, the software executing on clients 202 may be downloaded from server computer 206 to client computers 202 and installed as a plug-in or ACTIVEX™ control of a web browser. Accordingly, clients 202 may utilize ACTIVEX™ components/component object model (COM) or distributed COM (DCOM) components to provide a user interface on a display of client 202. The web server 210 is typically a program such as MICROSOFT'S INTERNET INFORMATION SERVER™.

Web server 210 may host an Active Server Page (ASP) or Internet Server Application Programming Interface (ISAPI) application 212, which may be executing scripts. The scripts invoke objects that execute business logic (referred to as business objects). The business objects then manipulate data in database 216 through a database management system (DBMS) 214. Alternatively, database 216 may be part of, or connected directly to, client 202 instead of communicating/obtaining the information from database 216 across network 204. When a developer encapsulates the business functionality into objects, the system may be referred to as a component object model (COM) system. Accordingly, the scripts executing on web server 210 (and/or application 212) invoke COM objects that implement the business logic. Further, server 206 may utilize MICROSOFT'S™ Transaction Server (MTS) to access required data stored in database 216 via an interface such as ADO (Active Data Objects), OLE DB (Object Linking and Embedding DataBase), or ODBC (Open DataBase Connectivity).

Generally, these components 200-216 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 202 and 206 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 202 and 206.

Software Embodiment Overview

Embodiments of the invention are implemented as a software application on a client 202 or server computer 206. Further, as described above, the client 202 or server computer 206 may comprise a thin client device or a portable device that has a multi-touch-based display.

DETAILED DESCRIPTION

Architecture has been described as the 'enclosure of space'. Indeed most buildings are conceived in two ways:
(1) as a 3D geometric envelope or enclosing form (that separates the outside from the inside); AND
(2) as the partitioning of the enclosed space into different constituent spaces (or rooms).

One might call such a conception a 'spatial' or idealized model of the building. Most conventional 'Building Information Modeling' applications adopt a different approach, by providing design tools that support the placement and editing of components (such as walls, floors, etc.) that represent the material aspects of the building. This may be referred to as a material or physical model of the building.

Figure 3B:
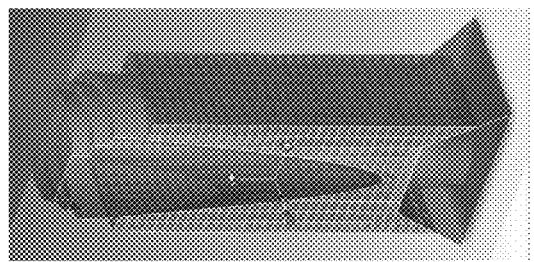
FIG. 3B illustrates a spatial information model of a building built with a 3D geometric modeling kernel in accordance with one or more embodiments of the invention.
Figure 3A:
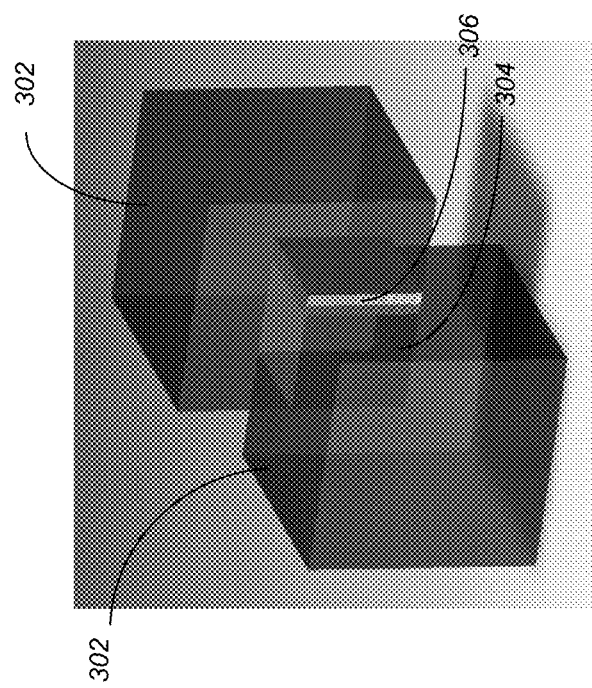
FIG. 3A illustrates a single non-manifold solid, consisting of three cells constructed by the non-regular union of two cubes in accordance with one or more embodiments of the invention.

It is of course recognized that at the end of an architectural design process, the design, engineering and construction teams should have produced a complete unambiguous 'building information model'. However, during an exploratory design process, it is important that the architect can build the lightest possible model using the least effort that gives him the most accurate feedback about his design ideas. A modeling process that combines spatial modeling (via non-manifold topology) and associative parametric modeling (via scripting) can facilitate this "light weight—least effort—maximum feedback" design methodology. The resulting spatial information model (and associated topological queries) can be used for:

- early structural analysis, using such tools as a structural engineering application (e.g., Robot Structural Analysis™ software that provides structural engineers with advanced building simulation and analysis capabilities for large complex, structures);
- early design energy analysis using tools such as web-based energy analysis applications (e.g., Green Building Studio™ energy analysis software);
- fire analysis (using computational fluid dynamics [CFD] simulation);
- egress analysis; and
- the topological and geometric support model for the material model of the building (see FIG. 3A and description below).

FIG. 3A illustrates a single non-manifold solid, consisting of three cells constructed by the non-regular union of two cubes 302. One of the faces of the inner cell 304 has been used as the supporting geometry for a wall component 306.

FIG. 3B illustrates a spatial information model built with a 3D geometric modeling kernel (e.g., ASM™). FIG. 3B is a cut-away model and illustrates a number of non-regular modeling operations that are unique to non-manifold topology. The initial solid was 'sliced' horizontally with floor planes and then vertically (with wall planes in X and Y). Finally a conical solid representing the atrium was 'imposed'. The resulting cellular topology structure can be interrogated with topological query functions.

To realize this concept, a set of special non-regular Boolean operations may be used to create non-manifold bodies and a series of topological classes to allow the designer to access the resulting spatial models. Topological query functions are provided to allow the designer to make a traversal of the spatial model of the building.

One may distinguish between:
- a spatial model of the building (as the partitioning of the building envelope into discrete cells representing the interior spaces or rooms); and
- the material model of the building which might use the topology of the spatial model (for example, the cells, faces, edges and vertices) as supporting geometry.

This topological and geometric modeling functionality is combined with the DesignScript™ associative modeling language. Spatial Information Modeling and parametric/associative modeling work well together and allow the designer to experiment with "what-if" scenarios. Changes to the spatial model can automatically update any downstream engineering analysis (such as Green Building Studio™ green energy analysis) and the dependent material model.

Manifold and Non-manifold Solids

A 3D manifold body has a boundary that separates the enclosed solid from the external void. The boundary is made of faces that have (interior) solid material on one side and the (exterior) void on the other. In a 3D manifold body, each edge represents the meeting of exactly two faces, so that even where faces join, there is still solid material on one side of the boundary and a void on the other.

The boundary of a body does not have to be connected—a body can have several disjoint pieces of boundary, as long as each connected piece of the boundary is closed. This means a single body can contain disjoint volumes of material, and a single volume can have one or more interior voids, where each is defined by a closed boundary with material on one side and the interior void on the other.

In practical terms, a manifold body without internal voids can be machined out of a single block of material.

A non-manifold solid also has a boundary (made of faces) that separates the enclosed solid from the external void. However, faces can also be "internal" (separating one region of interior from another). Thus, faces are either external (separating the interior [enclosed space] from the exterior [void]) or internal (separating one enclosed space [or cell] from another).

Furthermore a non-manifold solid can have edges where more than two faces meet, so space around the edge can be divided into more than two regions, each of which can be interior or exterior depending on the sidedness of the faces, thus dividing a solid into multiple distinct internal regions.

Regular and Non-regular Boolean Operations

One way to construct non-manifold bodies is by using non-regular Boolean operations. When Boolean operations are used to create a new body from input bodies, these inputs are often configured so that all or part of one input body intersects with the other input body, see FIG. 3A.

Generally with regular operations, external faces of the input bodies that are within the resulting body are removed.

Generally with non-regular operations, external faces of the input bodies that are within the resulting body are retained thus becoming double-sided interior faces.

Figure 4:
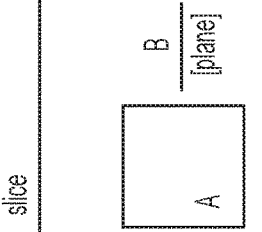
FIG. 4 illustrates the result of different regular or non-regular Boolean operations with manifold bodies as inputs in accordance with one or more embodiments of the invention.

FIG. 4 illustrates the result of different regular or non-regular Boolean operations using manifold bodies as inputs. Note: some operations (e.g., union and intersection) are symmetric, while other operations (e.g., difference, impose) are asymmetric. With asymmetric operations, there is the convention that one input is the "part" (A) and the other input is the "tool" (B).

One can compare:
- Regular union operation (where all external faces of the input bodies within the output body are removed);
- Non-regular union operation (where all external faces of the input bodies within the output body are retained, in this case generating three cells)
- Non-regular impose operation (where only the external faces of one input body within the output body are removed, in this case generating two cells) (literally "impose the tool on the part", so that the internal faces within the output body that are derived from the "tool" input remain, but the internal faces within the output body that are derived from the "part" are removed (in this example, generating two cells).

Note:
- There is no regular impose operation, because all regular operations remove the external faces of the tool from the interior of the resulting body.
- Embodiments of the invention may not allow non-regular intersection or difference operations, because such operations may include interactions of model boundaries and leave coincident boundaries unresolved. For example, non-regular difference and intersection operations may result in coincident face regions to remain in the resultant body (thereby having double sided outer faces).

In FIG. 3B, a practical example of applying multiple non-regular Boolean operations is illustrated. In this example there were multiple 'slice' operations using planes in different X, Y and Z direction, followed by an 'Impose' operation. This illustrates that even if the modeling process starts with manifold bodies, the results (after the first non-regular operation) will be a non-manifold body. Therefore, subsequent non-regular operations will use non-manifold bodies as input, as illustrated in FIG. 5.

FIG. 5 illustrates the result of different regular or non-regular Boolean operations with non-manifold bodies as inputs. Generally, with regular operations on non-manifold input bodies, internal faces of the input bodies that are within the resulting body are retained, but external faces of the input bodies that are within the resulting body are removed. However, some laminar faces may be created (specifically in the regular union of non-regular inputs) when the internal faces of the input bodies are retained, but the parts of the external faces of the input bodies now within the resulting body are removed. However, with a non-regular union operation, one body results with multiple cells.

One may compare the results of the impose operation with the results of a regular and non-regular union. There is no regular impose operation. However, in a non-regular impose operation, internal face regions of the blank (A) within the tool (B) are removed.

One may also compare the results of regular and non-regular imprint operations. In a regular imprint operation, the result is only imprinted edges of the tool (b) on the external faces of the blank (A) with no new cells created. However, in a non-regular imprint operation, the external faces of B within A are imprinted inside blank (A), thereby creating cells. A regular slice operation results in multiple bodies each with cells derived from splitting those in the original input non-manifold body. In contrast a non-regular slice operation on non-manifold inputs results in a single non-manifold body with new split cells.

In view of the above, generally, with non-regular operations on non-regular input bodies, external faces of the input bodies and internal faces of the input bodies that are within the resulting body are retained (except in the "impose" operation, where internal faces of the blank (A) within the tool (B) are removed.

Topology Classes Implemented

Figure 6:
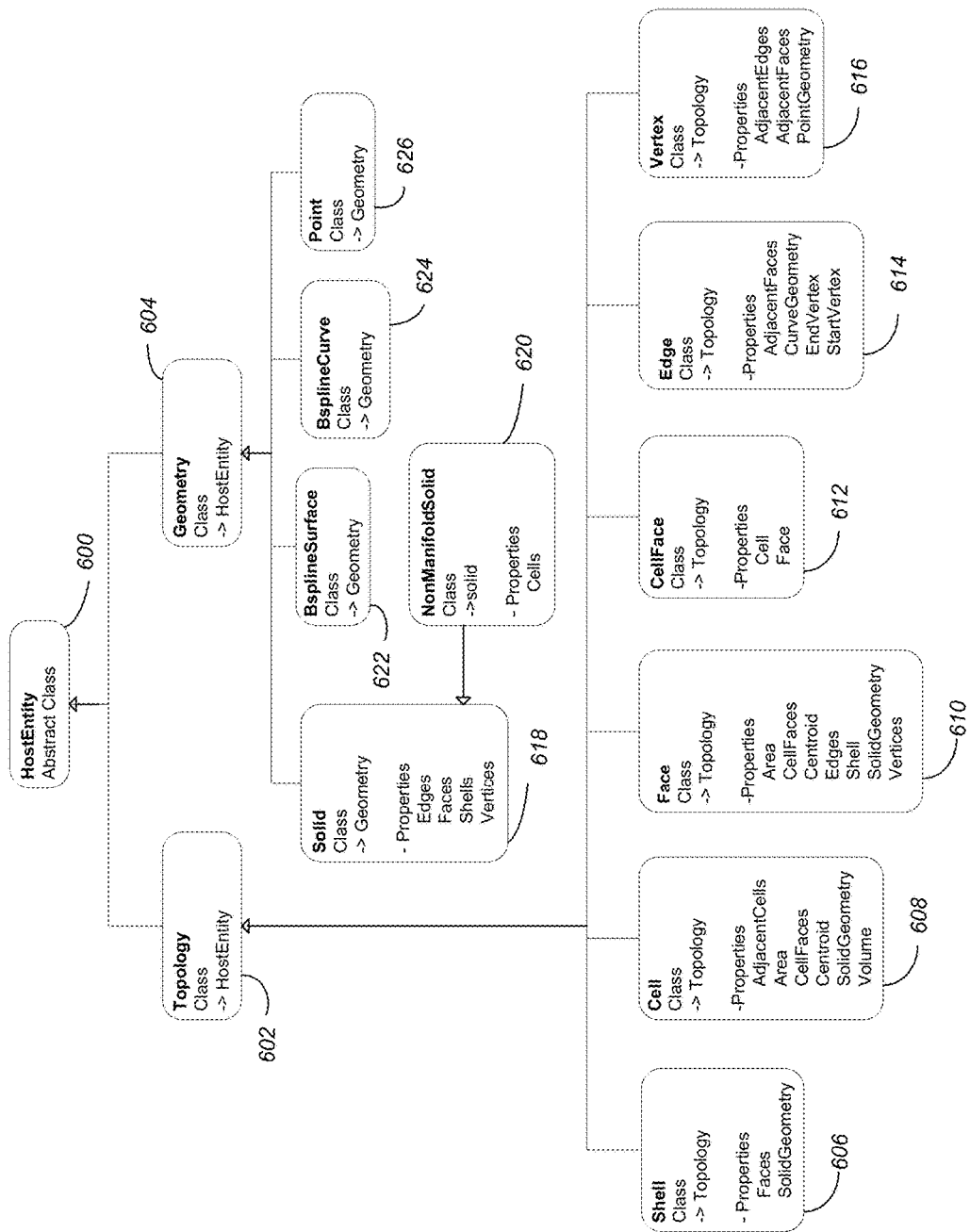
FIG. 6 illustrates geometry and topology classes in accordance with one or more embodiments of the invention.

FIG. 6 illustrates geometry (e.g., DesignScript™ geometry) and topology classes, with respective properties in accordance with one or more embodiments of the invention. The abstract host entity class 600 can be implemented as a topology class 602 and a geometry class 604.

The various topology classes include shell 606, cell 608, face 610, cellface 612, edge 614, and vertex 616.

Shell 606: The shell topology class 606 defines a connected set of Faces 610 in a manifold solid. A solid with a hollow void inside has two Shells, one external Shell and another internal Shell.

Cell 608: The cell topology class 608 defines a closed, continuous volume enclosing a spatial partition in a non-manifold solid.

Face 610: The face topology class 610 may define an interior-exterior face with material on one side and a void on the other, or it can be a double-sided interior face.

CellFace 612: The Faces 610 in a non-manifold model have either one or two CellFaces 612 attached to them (two in the case of a double-sided inside face). A Cell 608 can be queried for its constituent CellFaces 612.

Edge 614: There can be internal edges in a non-manifold model belonging to an internal face 610.

Vertex 616: There can be inside vertices in a non-manifold model.

The geometry class 604 may be implemented as solids 618 (e.g., a non-manifold solid 620), a B-spline surface 622, a B-spline curve 624, and/or a point 626.

With the range of manifold and non-manifold classes and the range of regular and non-regular Boolean operations, the designer is able to create manifold and non-manifold solid models. By exposing the properties of geometry classes 618-626 and topology classes 606-616 to the designer, the designer is able to make his/her own (e.g., independent) topological queries. These queries can be used to build a number of different spatial information models.

Spatial and Material Building Models

The idealized 'spatial' model of a building and the physical or material model of the building are interrelated.

The spatial model is the basis for the derived material model: If the architect starts with the idealized spatial model, then the resulting interior faces and edges can be used as the support geometry for the material components. However, there may be 'conceptual' boundaries between spaces that are not actually defined with material components (for example air conditioning zones in an auditorium). With the 'spatial model as the basis for deriving the material model methodology, only those partitions of the internal space that need to be 'materialized' are populated with components.

The material model is the basis for the derived spatial model: Conversely, it may be possible to extract or derive a spatial model of the building from the physical model, but this is exceedingly complex and error prone (for example, if the walls surrounding what is thought of as enclosed space are not 'water tight'). In addition there is the question of how to represent spatial partitioning for which there is no equivalent material component.

Figure 7:
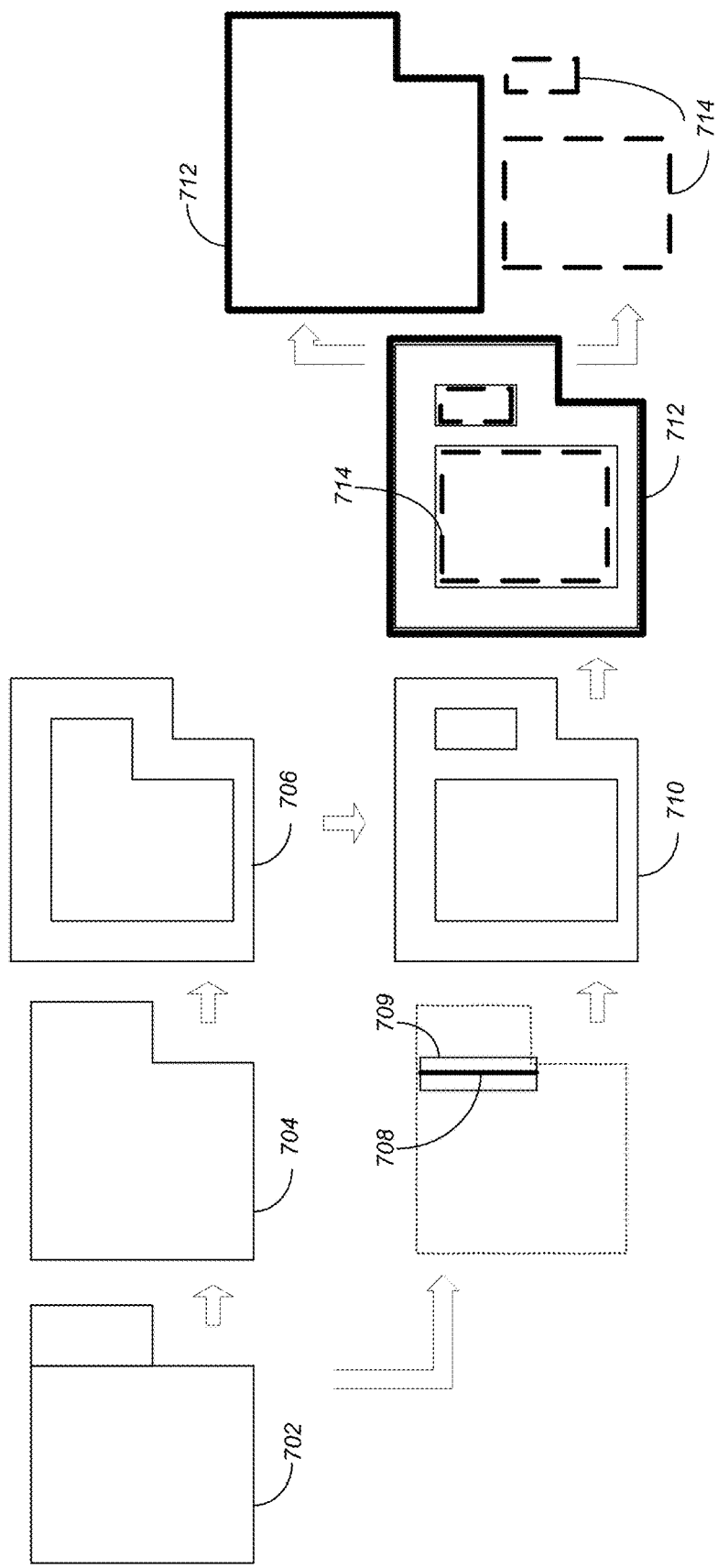
FIG. 7 illustrates the modeling operation to derive the material and spatial models from an initial non-manifold model in accordance with one or more embodiments of the invention.

FIG. 7 illustrates the modeling operation to derive a material and its corresponding spatial model from an initial non-manifold model in accordance with one or more embodiments of the invention.

The modeling starts with a non-manifold solid body 702 (shown in 2D) representing the idealized spatial form and partitioning of a building. Such a non-manifold model may contain cells used for initial volumetric analysis (e.g., for Green Building Studio™ analysis software), while faces and edges may be used as support for geometry for the material building model.

The outer shell 704 of the non-manifold solid 702 is extracted and converted to a manifold outer solid. The thin-shell 706 of the manifold "outer" solid may also be obtained by a regular shelling operation. Similarly, the double inside faces 708 of the non-manifold solid 702 are extracted and used to create offset solids 709.

The union 710 of the thin-shell 706 of the manifold "outer" solid with the offset solids 709 from the double inside faces 708 of the original non-manifold solid 702 may also be obtained. Such a union 710 represents the "thin-shell" model of the original non-manifold solid 702, and may be used to represent the "space take" of the material model.

The exterior shell 712 and interior shells 714 may also be extracted. Potentially, (depending on the thin-shell wall thickness), for each cell in the original non-manifold body 702, there will now be a resulting interior shell 714. The uses of the shell model 712 and 714 are varied. The exterior shell 712 (building envelope) that represents the "space take" of the whole building model, may be used in city zoning/rights to light. The interior shells 714 could be used to more accurately represent the resulting interior volumes.

The Use of the Spatial Information Model to Create a Material Building Model

To create a material building model (from a spatial information model), the user first develops a spatial non-manifold model of the building.

Subsequently (and optionally) this model can be used to:
Extract horizontal edges to define beams;
Extract vertical edges to define columns;
Extract exterior faces to define roof elements;
Extract interior horizontal faces to define floors (slabs);
Extract exterior vertical faces to define exterior walls and facades; and
Extract interior vertical faces to define interior walls and partitions.

The collection of columns, beams, slabs, roof panels, facade panels and interior partitions form the material model of the building.

Figure 8:
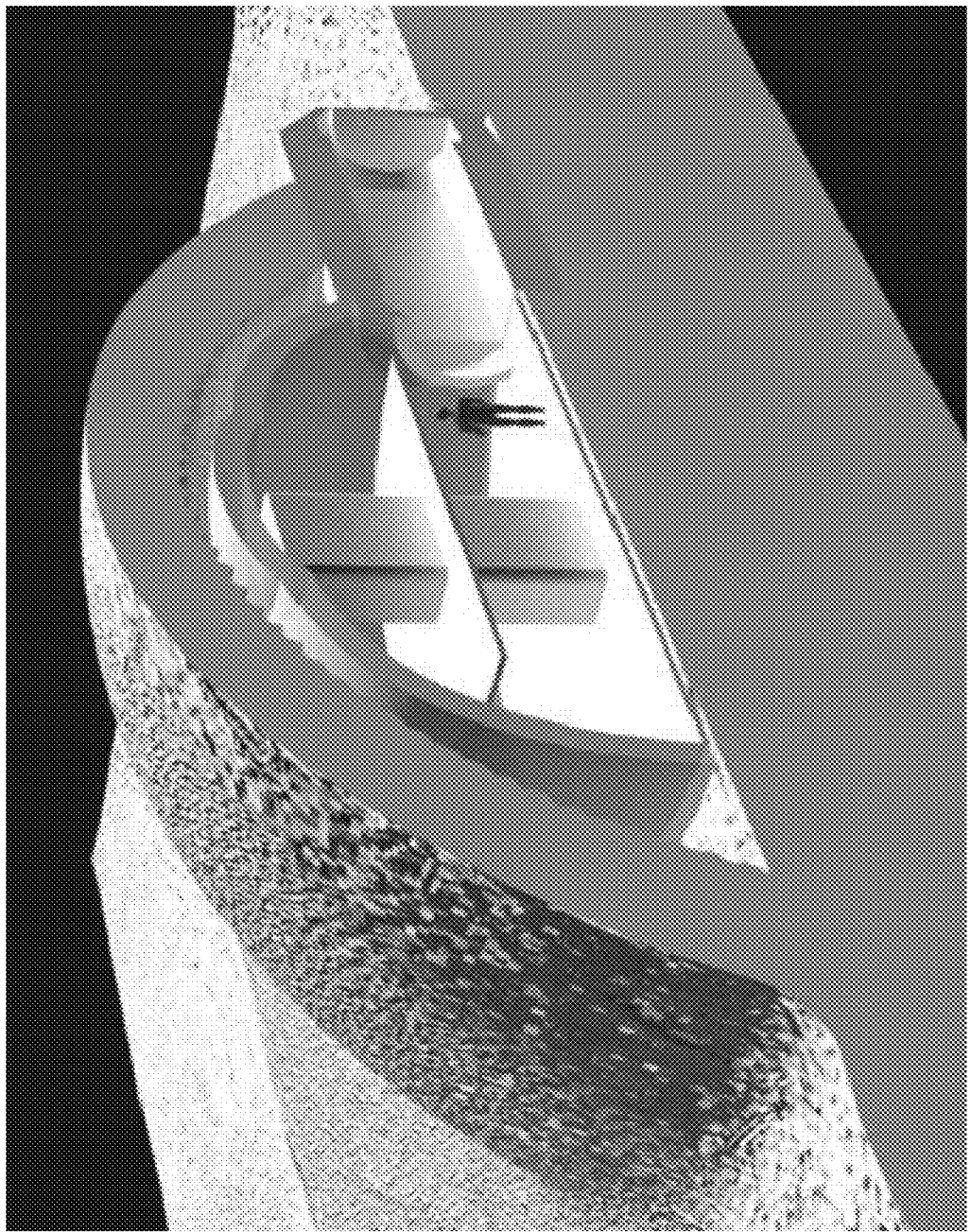
FIG. 8 illustrates the artistic view of a lunar habitat covered by a 3D printed regolith shelter in accordance with one or more embodiments of the invention.

Alternatively, the material model 710 could be used to '3D print' the complete material model of the building including the fabrication of the proposed moon base being designed by the European Space Agency. In this regard, FIG. 8 illustrates the artistic view of a lunar habitat covered by a 3D printed regolith shelter [from "3D Printing Technology for a moon outpost exploiting lunar soil", Ceccanti, F., et al. 61$^{st}$ Int. Astronautical Congress Prague, 2010. http://www.s-pacerenaissance.org/projects/LHD/Praga_Conference_Luna.pdf]

Using a Non-Manifold Spatial Model to Create Alternative Analytical and Material Building Models The spatial model of a building and the analytical or material models of the building are interrelated. The spatial model consists of cells, faces and edges.

Cells can represent the enclosed spaces or rooms of the building;
Faces can be used as the supporting geometry for "area" based material components (walls, floors, roofs, etc.);
Edges can be used as the supporting geometry for "curvilinear" based material components, for example structural members (columns, beams) or for edge connectors between face-based "area" components; and
Vertices can be used as the location of "point" based connectors between edge based "curvilinear" components.

Spatial Information Use/Building a Structural Model from a Non-Manifold Spatial Model A spatial non-manifold model of the building can be used to:
Extract horizontal edges to define beams;
Extract vertical edges to define columns;
Extract exterior faces to define roof elements;
Extract interior horizontal faces to define floors (slabs);
Extract exterior vertical faces to define exterior walls and facades; and
Extract interior vertical faces to define interior walls and partitions.

Figure 9:
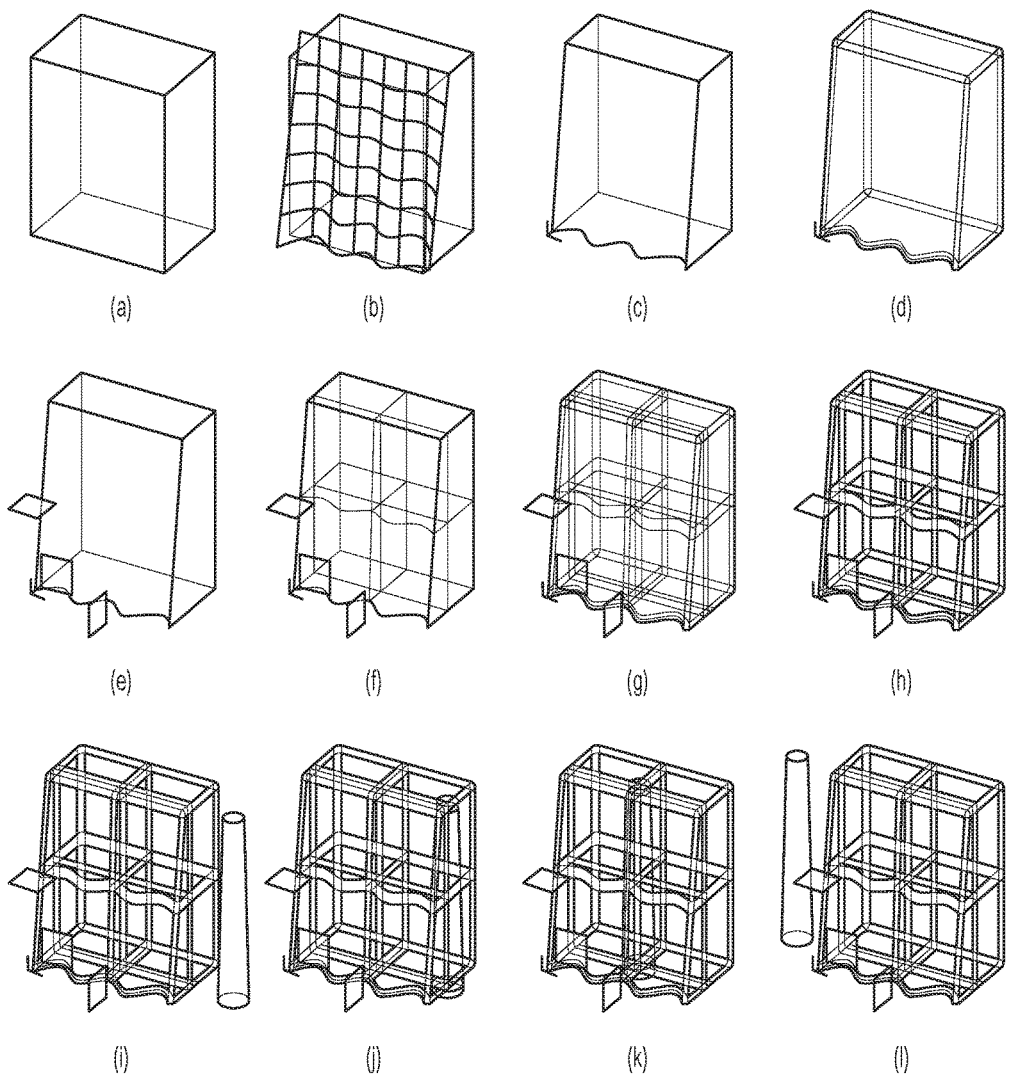
FIG. 9 illustrates an exemplary modeling sequence to construct a non-manifold spatial model of a building and the use of edges of the model to construct a structural model in accordance with one or more embodiments of the invention.

FIG. 9 illustrates an exemplary modeling sequence to construct a non-manifold spatial model of a building and the use of edges of the model to construct a structural model in accordance with one or more embodiments of the invention. The modeling illustrated in FIG. 9 may be performed by a geometric modeling application (e.g., the ASM™ geometric modeling kernel). The geometric modeling capabilities may then be leveraged for a specific architectural spatial modeling and to drive a material and analytical model of the building.

The exemplary modeling sequence starts with a solid primitive at (a). A trimming surface is defined at (b) and then used (at (c)) to trim the solid thereby creating a manifold building envelope.

The edges of the manifold building envelope are used as geometric supports for curvilinear structural members at (d). Horizontal, vertical, and lateral "slicing" planes are then created at (e). The slicing planes are used to slice the manifold building envelope to create a non-manifold spatial building model at (f). The edges of the non-manifold spatial building model are used as the geometric supports for the curvilinear structural members at (g).

At (h), the non-manifold spatial building model is hidden to show the structural members.

At (i), a cone primitive is created to represent an atrium and an "impose" operation is used on the spatial building model. The atrium is then moved so that it intersects with the spatial building model while creating new cells and edges at (j). As the atrium moves through the spatial model (k), new edges create corresponding structural members. Finally, the atrium is moved out of the spatial building model (at (l)) and edges and structural members adjust accordingly.

Accordingly, the sequence of FIG. 9 illustrates a combined spatial, analytical, and material modeling process:

The outer form of the building is modeled as a solid (e.g., step (a));
The outer form is trimmed by a surface (e.g., steps (b) and (c));
The trimmed outer form is split by a set of horizontal planes (representing floors) and vertical planes (representing the spatial organization of the building) (e.g., steps (e)-(f)); and
The collection of resulting edges of the non-manifold model are extracted and used as the basis for creating a structural model of the building (e.g., steps (g)-(l)).

Using the number of faces associated with each edge it is possible to determine the position of each edge within the spatial model and to populate different types of edges, identified based on position, with an appropriate type of structural component.

edges with 2 faces imply an edge at an external corner position;
edges with 3 faces imply an edge at an external mid-facade position; and
edges with 4 faces imply an edge within an internal region.

In view of the above, it may be noted that non-manifold topology and non-regular Boolean operations (e.g., non-regular union) may exist in the prior art in one or more forms. In contrast, unavailable in the prior art, embodiments of the invention provide for:

(1) the use of impose operations (e.g., a sort of asymmetrical union) as well as a non-regular slice operation;

(2) the use of the count of the number of faces at a single edge to determine the position of that edge in the topology;

(3) the use of the face count per edge (above) to select structural components;

(4) the use of the faces (whether outside face or inside face) combined with the geometric orientation of these faces (for example, horizontal or not) to populate the building model with exterior or interior wall, floor or roof components;

(5) the use of non-manifold topology, with the internal spaces representing the cells of the non-manifold model, and topological queries used to find the adjacent cells and faces of a given cell as input to energy analysis and other building performance analysis and simulation software tools; and (6) the ability to vary the overall modeling configuration (for example, presence and position of an atrium within the overall building envelope) and the consequential associative re-computation of the manifold topology (and hence structural configuration and spatial decomposition).

The Use of the Spatial Information Model for Energy Analysis (e.g., via Green Building Studio™ Energy Analysis Software)

Figure 10:
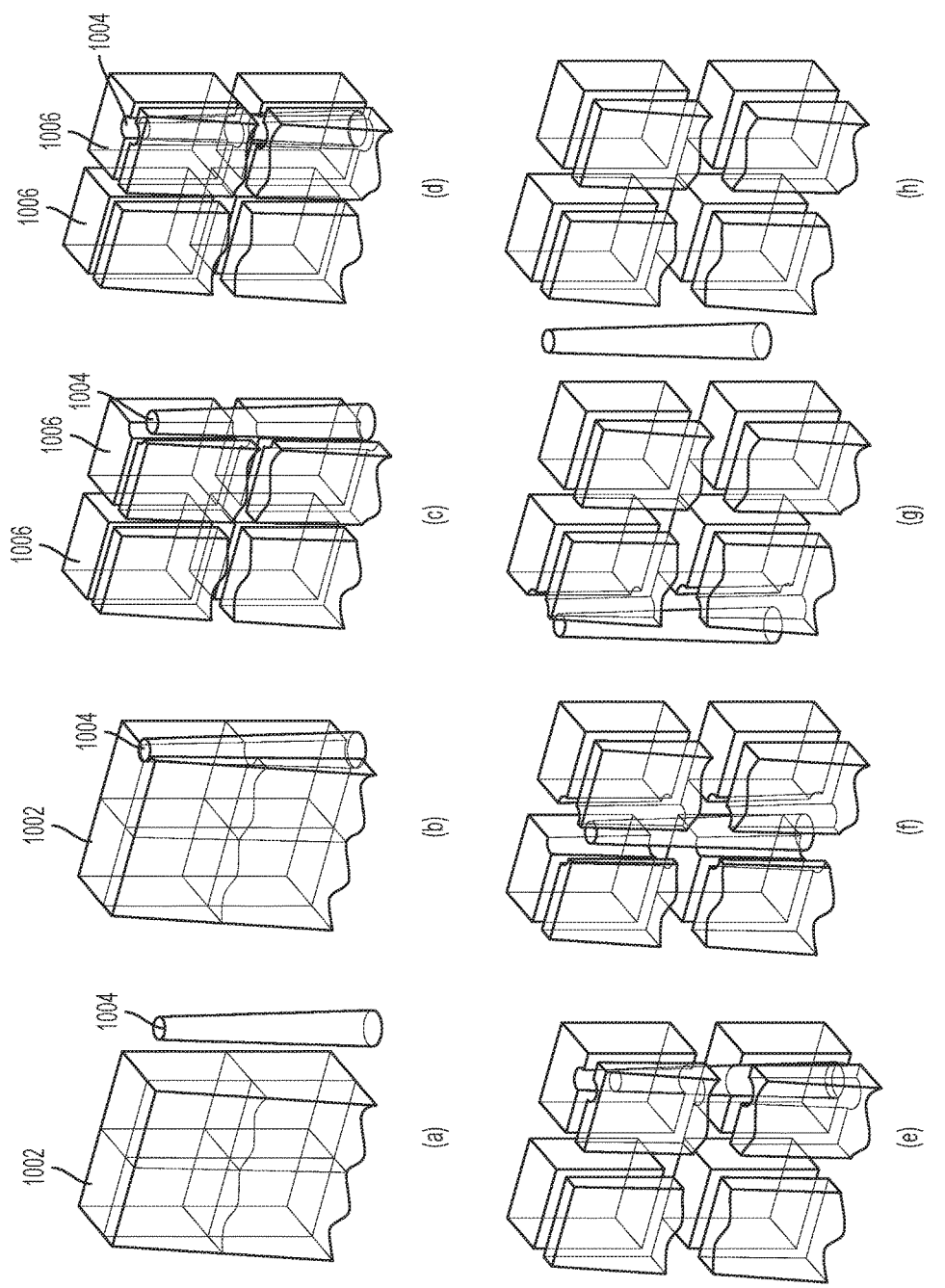
FIG. 10 illustrates an exemplary modeling sequence to construct a non-manifold spatial model of a building and the use of the cells within the model to construct volumetric and spatial adjacency data suitable for input into energy analysis applications in accordance with one or more embodiments of the invention.

FIG. 10 illustrates an exemplary modeling sequence to construct a non-manifold spatial model of a building and the use of the cells within the model to construct volumetric and spatial adjacency data suitable for input into energy analysis applications in accordance with one or more embodiments of the invention. In other words, FIG. 10 illustrates the volumetric and spatial analysis of a building realized by extracting cellular data from a non-manifold spatial building model.

The exemplary modeling sequence begins at step (a) with the non-manifold spatial building 1002 and the atrium 1004. At step (b), the atrium 1004 is "imposed" onto the spatial building model 1002. At step (c), the spatial building model 1002 is exploded so that the individual cells 1006 are distinct. Steps (d)-(h) illustrate the movement of the atrium 1004 through the spatial building model 1002.

The key topological elements illustrated in FIG. 10 are the cell 1006 and the faces that bound each cell 1006. In embodiments of the invention, each topological elements may be given the following additional attributes to provide a complete data model for an energy analysis:

Cells
  Volume
  Desired internal conditions
  Occupancy data
  Air change rate
  Additional equipment loads
  Light loads
Faces
  Area
  Thermal properties The topological analysis defines which faces are external or between cells, therefore which cells are adjacent and therefore may affect the loads on the other cells. The notional thickness of the faces multiplied by the face area can be used to factor the cell volume, to arrive at a reasonably accurate volumetric data without the need for a precise building model. Certainly, this volumetric data will be within an acceptable tolerance when considered against the accuracy of the other data involved.

Figure 11:
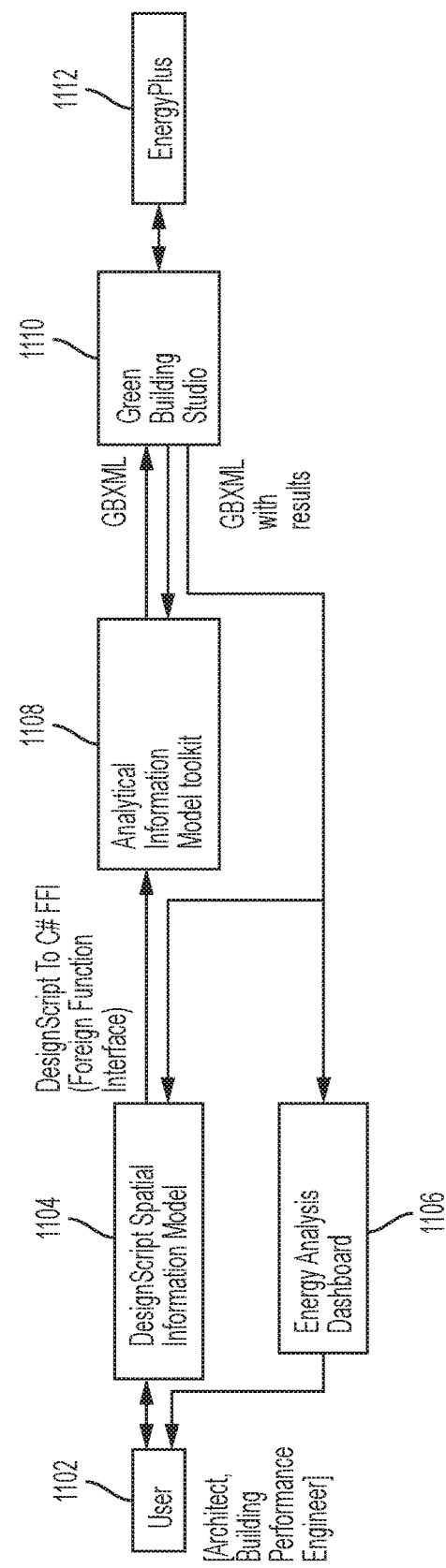
FIG. 11 illustrates an exemplary use of an analytical information modeling (AIM) toolkit to integrate a spatial information model with energy analysis software in accordance with one or more embodiments of the invention.

FIG. 11 illustrates an exemplary use of an analytical information modeling (AIM) toolkit to integrate a spatial information model with energy analysis software in accordance with one or more embodiments of the invention. A user 1102 (e.g., an architect, building performance engineer, etc.) interfaces with a DesignScript™ spatial information model 1104 and energy analysis software dashboard 1106.

The DesignScript™ spatial information model 1104 may utilize functions in an analytical information model toolkit by using a foreign function interface (FFI) (e.g., utilizing a C# FFI of the AIM toolkit 1108). In this regard, the DesignScript spatial information model 1104 may provide cellular and face data to the AIM toolkit 1108. The AIM toolkit 1108 may then export the cellular and face data to an energy analysis application 1110 such as Green Building Studio™. The export of the cellular and face data may be in an extensible markup language (XML) based on a specific schema such as GBXML (Green Building extensible markup language). The resulting energy analysis may be returned for display within DesignScript 1104, or via other energy analysis dashboards 1106. As illustrated, the energy analysis may also be displayed using an energy analysis and thermal load simulation program 1112 (e.g., the EnergyPlus™ simulation application).

Integration with DesignScript

Parametric/associative modeling and spatial information modeling applications work well together for a variety of reasons. Designers and architects are often interested in several "what-if" scenarios where they can experiment with alternative values for key design parameters and generate alternative design solutions. Parametric/associative modeling is a powerful tool that enables users to achieve this. In the context of Spatial Information Modeling, for example, designers can harness associative modeling to easily conceptualize different building configurations. Making simple tweaks to any of the spatial, material or analysis models can associatively update the entire dependency graph and re-execute the analysis to quickly generate several design alternatives and enable users to choose the most optimal or economical structural or energy-saving solution.

Logical Flow

Figure 12:
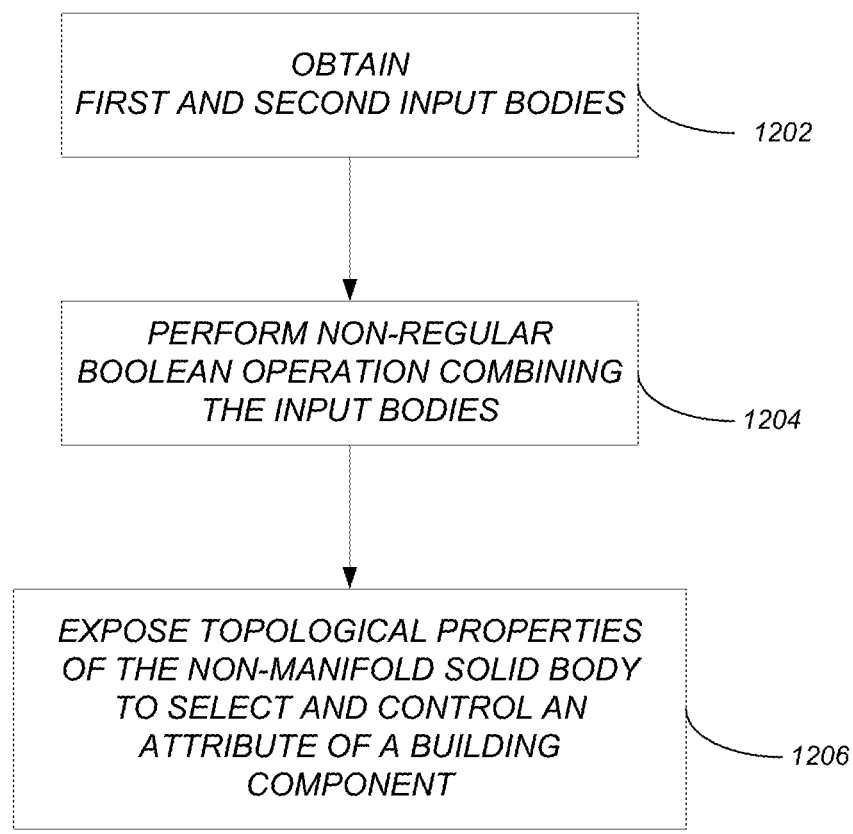
FIG. 12 illustrates the logical flow for utilizing a non-manifold spatial model in accordance with one or more embodiments of the invention.

FIG. 12 illustrates the logical flow for utilizing a spatial model in accordance with one or more embodiments of the invention.

At step 1202, a first input body and a second input body (which may be manifold or non-manifold bodies) are obtained.

At step 1204, a non-regular Boolean operation is performed that combines the first input body and the second input body to create and output an output body. The output body is a spatial model represented by a non-manifold solid body.

The non-regular Boolean operation may be an impose operation that imposes the first input body on the second input body. In such an impose operation, internal faces within the output non-manifold solid body that are derived from the first input body remain and internal faces within the output non-manifold solid body that are derived from the second input body are removed.

The non-regular Boolean operation may also be a slice operation that slices the first input body by the second input body (e.g., which is a plane). The output body defines a single body with two cells based on the second input body. Further, the output body retains the plane from the second input body.

At step 1206, a topological property of the non-manifold solid body is exposed to select and control an attribute (e.g., a type, size, and/or geometry) of a building component represented by the non-manifold solid body. The topological property may be exposed via a set of topological classes that include query functions used to traverse the spatial model.

The topological property and a geometry of edges of the non-manifold solid body may be used to control an edge (linear or curvilinear) based (structural or non-structural) building component (e.g., columns and beams). Such a topological property of the edges may be a property of constituent faces that forms the edges and defines each constituent face as an outside face or an inside face.

Alternatively (or in addition), the topological property and a geometry of faces of the non-manifold solid body may be used to control a face (planar or non-planar) based (structural or non-structural) building component (e.g., slabs). The topological property of the faces defines each face as an outside face or an inside face.

The topological property and the geometry of cells of the non-manifold model may further be used to represent a partitioning of a building into its constituent spaces (e.g., rooms). In such an embodiment, the attribute may define occupancy data (e.g., absolute, per unit volume, per unit area, etc.) of the constituent spaces. Further, both the partitioning and the occupancy data may be used as input for energy analysis (and other related simulation applications).

CONCLUSION

Embodiments of the invention present a novel application of non-manifold topologies together with parametric and associative scripting to idealize, design, and model the spatial organization of buildings, to use this information to create different analytical and material models of a building (e.g., as the support geometry for a material model of a building and to perform useful environmental analyses of these enclosures). The core of the DesignScript™ system is a set of unified geometry and topology classes that can be driven through a number of different programming paradigms. Without the ability to manipulate such spatial models parametrically and programmatically, it is doubtful whether a user could "handcraft" such complex geometry using interactive direct manipulations or whether a user could systematically explore alternative configurations and options. Accordingly, a modeling process that combines spatial modeling (via non-manifold topology) and associative parametric modeling (via end-user scripting) can facilitate a "light weight —least effort—maximum feedback" design methodology.

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for utilizing a spatial model comprising:
    (a) obtaining a first input body and a second input body for a building;
    (b) performing a non-regular Boolean operation combining the first input body and the second input body to create and output an output body, wherein:
        (1) the output body comprises a spatial model represented by a non-manifold solid body, wherein the spatial model represents an enclosure of space of the building, and the building is partitioned into discrete cells representing interior spaces or rooms of the building; and
        (2) in the non-regular Boolean operation, external faces of the first input body and the second input body that are within the output body are retained thus becoming double-sided interior faces; and
    (c) exposing a topological property of the non-manifold solid body to select and control an attribute of a building component represented by the non-manifold solid body.

2. The computer-implemented method of claim 1, wherein:
    the non-regular Boolean operation comprises an impose operation that imposes the first input body on the second input body;
    internal faces within the output non-manifold solid body that are derived from the first input body remain; and
    internal faces within the output non-manifold solid body that are derived from the second input body are removed.

3. The computer-implemented method of claim 1, wherein:
    the second input body comprises a plane;
    the non-regular Boolean operation comprises a slice operation that slices the first input body by the second input body;
    the output body retains the plane from the second input body;
    the output body comprises a single body with two cells based on the second input body.

4. The computer-implemented method of claim 1, wherein the first input body and the second input body comprise manifold solid bodies.

5. The computer-implemented method of claim 1, wherein:
    the topological property is exposed via a set of topological classes; and
    the topological classes comprise one or more query functions used to traverse the spatial model.

6. The computer-implemented method of claim 5, wherein the attribute comprises a type, a size, and a geometry.

7. The computer-implemented method of claim 5, wherein the topological property and a geometry of edges of the non-manifold solid body are used to control an edge based building component.

8. The computer-implemented method of claim 7, wherein the topological property of the edges comprises a property of constituent faces forming the edges and defines each constituent face as an outside face or an inside face.

9. The computer-implemented method of claim 5, wherein the topological property and a geometry of faces of the non-manifold solid body are used to control a face based building component.

10. The computer-implemented method of claim 9, wherein the topological property of the faces defines each face as an outside face or an inside face.

11. The computer-implemented method of claim 1, wherein:
    the topological property and the geometry of cells of the non-manifold model are used to represent a partitioning of a building into constituent spaces;
    the attribute comprises occupancy data of the constituent spaces; and
    the partitioning and occupancy data are used as input for energy analysis.

12. A non-transitory computer readable storage medium encoded with computer program instructions which when accessed by a computer causes the computer to load the program instructions to a memory therein creating a special purpose data structure causing the computer to operate as a specially programmed computer, executing a method of utilizing a spatial model, comprising:
    (a) obtaining, in the specially programmed computer, a first input body and a second input body for a building;
    (b) performing, in the specially programmed computer, a non-regular Boolean operation combining the first input body and the second input body to create and output an output body, wherein:

(1) the output body comprises a spatial model represented by a non-manifold solid body, wherein the spatial model represents an enclosure of space of the building, and the building is partitioned into discrete cells representing interior spaces or rooms of the building; and (2) in the non-regular Boolean operation, external faces of the first input body and the second input body that are within the output body are retained thus becoming double-sided interior faces; and (c) exposing, via the specially programmed computer, a topological property of the non-manifold solid body to select and control an attribute of a building component represented by the non-manifold solid body.

13. The non-transitory computer readable storage medium of claim 12, wherein:

the non-regular Boolean operation comprises an impose operation that imposes the first input body on the second input body;

internal faces within the output non-manifold solid body that are derived from the first input body remain; and internal faces within the output non-manifold solid body that are derived from the second input body are removed.

14. The non-transitory computer readable storage medium of claim 12, wherein:

the second input body comprises a plane;

the non-regular Boolean operation comprises a slice operation that slices the first input body by the second input body;

the output body retains the plane from the second input body;

the output body comprises a single body with two cells based on the second input body.

15. The non-transitory computer readable storage medium of claim 12, wherein the first input body and the second input body comprise manifold solid bodies.

16. The non-transitory computer readable storage medium of claim 12, wherein:

the topological property is exposed via a set of topological classes; and the topological classes comprise one or more query functions used to traverse the spatial model.

17. The non-transitory computer readable storage medium of claim 16, wherein the attribute comprises a type, a size, and a geometry.

18. The non-transitory computer readable storage medium of claim 16, wherein the topological property and a geometry of edges of the non-manifold solid body are used to control an edge based building component.

19. The non-transitory computer readable storage medium of claim 18, wherein the topological property of the edges comprises a property of constituent faces forming the edges and defines each constituent face as an outside face or an inside face.

20. The non-transitory computer readable storage medium of claim 16, wherein the topological property and a geometry of faces of the non-manifold solid body are used to control a face based building component.

21. The non-transitory computer readable storage medium of claim 20, wherein the topological property of the faces defines each face as an outside face or an inside face.

22. The non-transitory computer readable storage medium of claim 12, wherein:

the topological property and the geometry of cells of the non-manifold model are used to represent a partitioning of a building into constituent spaces;

the attribute comprises occupancy data of the constituent spaces; and the partitioning and occupancy data are used as input for energy analysis.

* * * * *